US008955347B2

(12) United States Patent
Campbell et al.

(10) Patent No.: US 8,955,347 B2
(45) Date of Patent: Feb. 17, 2015

(54) AIR-SIDE ECONOMIZER FACILITATING LIQUID-BASED COOLING OF AN ELECTRONICS RACK

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 13/187,561

(22) Filed: Jul. 21, 2011

(65) Prior Publication Data

US 2013/0019614 A1    Jan. 24, 2013

(51) Int. Cl.
  *F25D 23/12*   (2006.01)
  *F25D 17/02*   (2006.01)
  *H05K 7/20*    (2006.01)

(52) U.S. Cl.
  CPC ........ *H05K 7/20136* (2013.01); *H05K 7/20209* (2013.01); *H05K 7/203* (2013.01); *H05K 7/20745* (2013.01); *H05K 7/20781* (2013.01)
  USPC .............. 62/259.2; 62/434; 62/435; 62/259.4; 165/104.33; 361/678; 361/679.47; 361/679.49; 361/679.52

(58) Field of Classification Search
  CPC ......... F24F 7/00; F24F 13/00; F24F 2012/00; F28B 1/06
  USPC ......... 62/259.2, 434, 435, 259.4; 165/104.33; 361/678, 679.47, 679.49, 679.52
  See application file for complete search history.

(56) References Cited

U.S. PATENT DOCUMENTS

| 4,567,733 A | 2/1986 | Mecozzi |
| 5,832,988 A | 11/1998 | Mistry et al. |

(Continued)

FOREIGN PATENT DOCUMENTS

JP    2010206055 A    9/2010

OTHER PUBLICATIONS

Campbell et al., "Liquid-Cooled Electronics Rack with Immersion-Cooled Electronic Subsystems and Vertically-Mounted, Vapor-Condensing Unit". U.S. Appl. No. 12/825,745, filed Jun. 29, 2010.

(Continued)

*Primary Examiner* — Frantz Jules
*Assistant Examiner* — Erik Mendoza-Wilkenfe
(74) *Attorney, Agent, or Firm* — Steven Chiu, Esq.; Kevin P. Radigan, Esq.; Heslin Rothenberg Farley & Mesiti P.C.

(57) ABSTRACT

A cooling apparatus and method are provided for cooling an electronic subsystem of an electronics rack. The cooling apparatus includes a local cooling station, which has a liquid-to-air heat exchanger and ducting for directing a cooling airflow across the heat exchanger. A cooling subsystem is associated with the electronic subsystem of the rack, and includes either a housing facilitating immersion cooling of electronic components of the electronic subsystem, or one or more liquid-cooled structures providing conductive cooling to the electronic components of the electronic subsystem. A coolant loop couples the cooling subsystem to the liquid-to-air heat exchanger of the local cooling station. In operation, heat is transferred via circulating coolant from the electronic subsystem and rejected in the liquid-to-air heat exchanger of the local cooling station to the cooling airflow passing across the liquid-to-air heat exchanger. In one embodiment, the cooling airflow is outdoor air.

18 Claims, 12 Drawing Sheets

(56) References Cited

U.S. PATENT DOCUMENTS

| | | | |
|---|---|---|---|
| 6,164,369 A | 12/2000 | Stoller | |
| 6,672,955 B2 | 1/2004 | Charron | |
| 7,007,501 B2 | 3/2006 | Hu | |
| 7,173,820 B2 | 2/2007 | Fink et al. | |
| 7,365,973 B2 | 4/2008 | Rasmussen et al. | |
| 7,477,514 B2 | 1/2009 | Campbell et al. | |
| 7,486,511 B1 | 2/2009 | Griffel et al. | |
| 7,492,593 B2* | 2/2009 | Campbell et al. | 361/696 |
| 7,724,524 B1 | 5/2010 | Campbell et al. | |
| 7,753,766 B2 | 7/2010 | Master et al. | |
| 7,885,070 B2 | 2/2011 | Campbell et al. | |
| 7,903,407 B2* | 3/2011 | Matsushima et al. | 361/695 |
| 7,916,483 B2 | 3/2011 | Campbell et al. | |
| 2003/0235036 A1* | 12/2003 | Ostby | 361/700 |
| 2004/0144118 A1 | 7/2004 | Herbert | |
| 2006/0002080 A1 | 1/2006 | Leija et al. | |
| 2009/0086428 A1 | 4/2009 | Campbell et al. | |
| 2009/0086432 A1 | 4/2009 | Campbell et al. | |
| 2009/0126909 A1 | 5/2009 | Ellsworth, Jr. et al. | |
| 2009/0268404 A1 | 10/2009 | Chu et al. | |
| 2010/0101759 A1 | 4/2010 | Campbell et al. | |
| 2010/0101765 A1* | 4/2010 | Campbell et al. | 165/104.33 |
| 2010/0103618 A1 | 4/2010 | Campbell et al. | |
| 2010/0130117 A1 | 5/2010 | Larsen | |
| 2010/0136895 A1 | 6/2010 | Sgro | |
| 2010/0170275 A1* | 7/2010 | Konrad et al. | 62/259.1 |
| 2010/0188810 A1 | 7/2010 | Anderson et al. | |
| 2010/0236772 A1 | 9/2010 | Novotny et al. | |
| 2010/0275618 A1 | 11/2010 | Beitelmal et al. | |
| 2011/0026225 A1 | 2/2011 | Ostwald et al. | |
| 2011/0075353 A1* | 3/2011 | Attlesey et al. | 361/679.47 |
| 2011/0103019 A1 | 5/2011 | Campbell et al. | |
| 2011/0134604 A1 | 6/2011 | Attlesey | |
| 2011/0154842 A1 | 6/2011 | Hedari et al. | |
| 2011/0168793 A1* | 7/2011 | Kreft et al. | 236/44 |
| 2011/0203785 A1* | 8/2011 | Federspiel et al. | 165/200 |
| 2012/0006038 A1* | 1/2012 | Sharma et al. | 62/97 |
| 2013/0021746 A1 | 1/2013 | Campbell et al. | |
| 2013/0068423 A1 | 3/2013 | Campbell et al. | |
| 2013/0068441 A1 | 3/2013 | Campbell et al. | |

OTHER PUBLICATIONS

Campbell et al., "Immersion-Cooling Apparatus and Method for an Electronic Subsystem of an Electronics Rack". U.S. Appl. No. 12/825,756, filed Jun. 29, 2010.

Campbell et al., "Interleaved, Immersion-Cooling Apparatus and Method for an Electronic Subsystem of an Electronics Rack". U.S. Appl. No. 12/825,761, filed Jun. 29, 2010.

Campbell et al., "Interleaved, Immersion-Cooling Apparatuses and Methods for Cooling Electronic Subsystems". U.S. Appl. No. 12/825,776, filed Jun. 29, 2010.

Campbell et al., "Liquid-Cooled Electronics Rack with Immersion-Cooled Electronic Subsystems". U.S. Appl. No. 12/825,781, filed Jun. 29, 2010.

Campbell et al., Office Action for U.S. Appl. No. 13/676,198, filed Nov. 14, 2012, (U.S. Patent Publication No. 2013/0068423 A1 ), dated Sep. 6, 2013 (22 pages).

Campbell et al., Office Action for U.S. Appl. No. 13/187,563, filed Jul. 21, 2011 (U.S. Patent Publication No. 2013/0021746 A1), dated May 22, 2014 (30 pages).

Campbell et al., Notice of Allowance for U.S. Appl. No. 13/676,198, filed Nov. 14, 2012 (U.S. Patent Publication No. 2013/0068423 A1), dated Apr. 10, 2014 (15 pages).

Campbell et al., Notice of Allowance for U.S. Appl. No. 13/187,563, filed Jul. 21, 2011 (U.S. Patent Publication No. 2013/0021746 A1), dated Sep. 25, 2014 (12 pages).

Campbell et al., Office Action for U.S. Appl. No. 13/676,212, filed Nov. 14, 2012 (U.S. Patent Publication No. 2013/0068441 A1), dated Sep. 25, 2014 (17 pages).

* cited by examiner

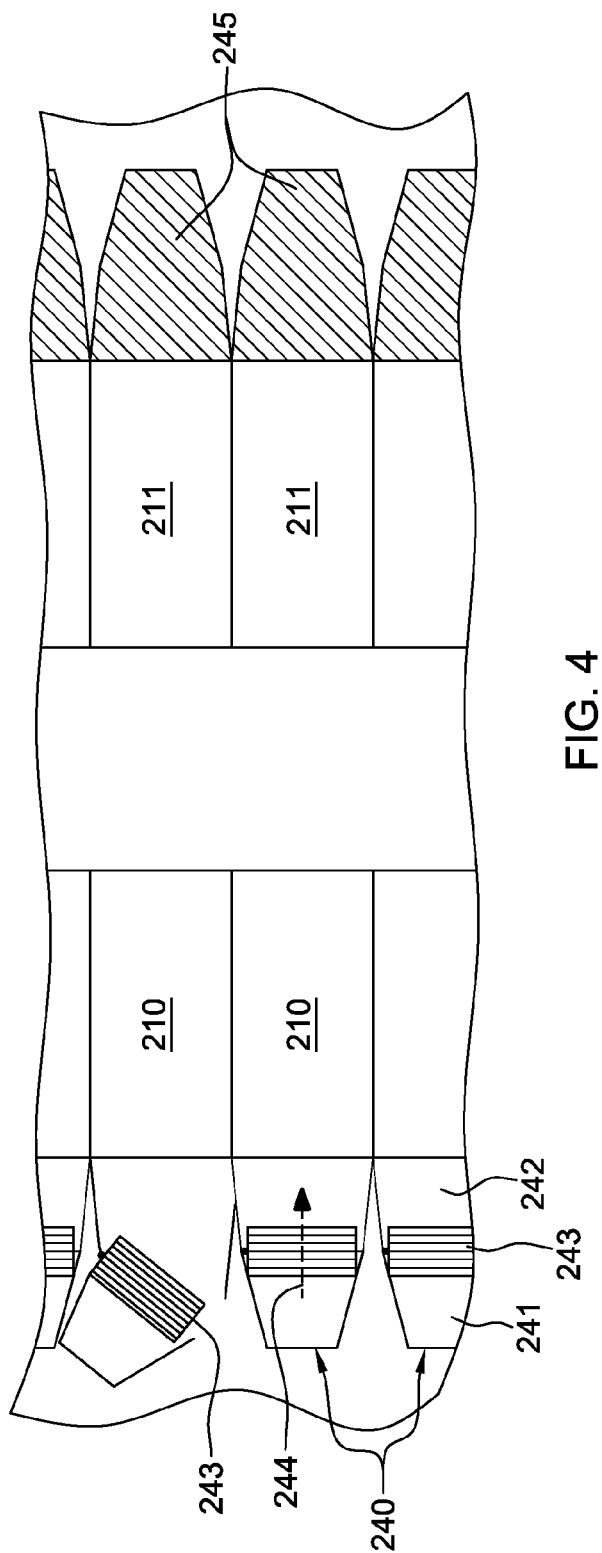

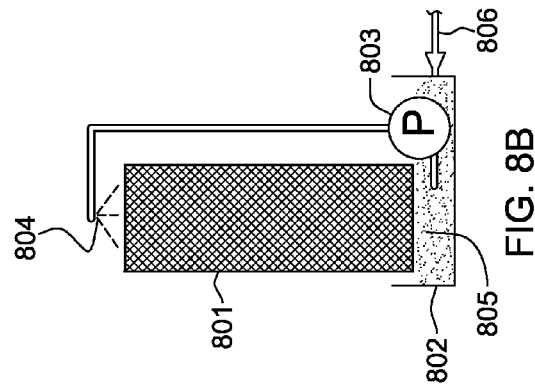
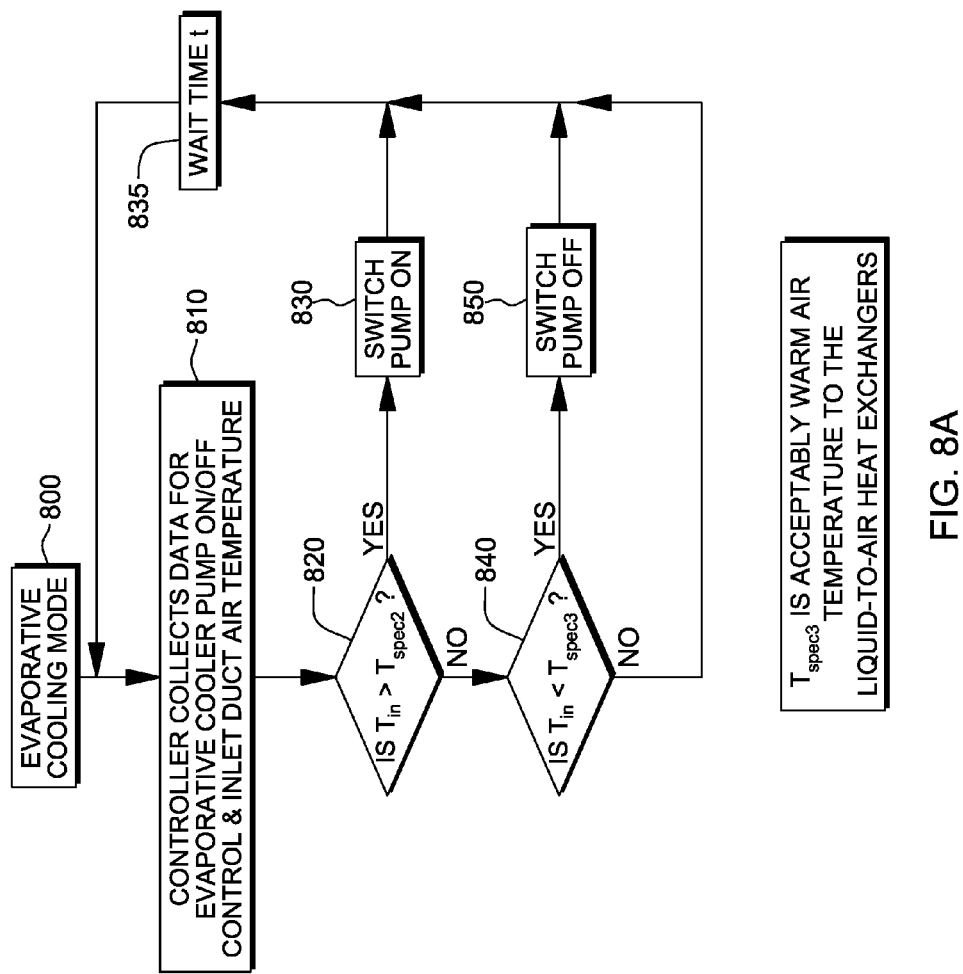
FIG. 8B
FIG. 8A

AIR-SIDE ECONOMIZER FACILITATING LIQUID-BASED COOLING OF AN ELECTRONICS RACK

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics (or IT) rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, provided herein is a cooling apparatus which includes: at least one local cooling station associated with at least one electronics rack comprising at least one electronic subsystem, each local cooling station comprising a liquid-to-air heat exchanger, and ducting for directing a cooling airflow across the liquid-to-air heat exchanger; at least one cooling subsystem associated with the at least one electronic subsystem, one cooling subsystem of the at least one cooling subsystem being associated with a respective electronic subsystem of the at least one electronic subsystem, the one cooling subsystem comprising at least one of a housing facilitating immersion cooling of one or more electronic components of the respective electronic subsystem, or a liquid-cooled structure providing conductive cooling of one or more electronic components of the respective electronic subsystem; and at least one coolant loop, one coolant loop of the at least one coolant loop coupling the one cooling subsystem to the liquid-to-air heat exchanger of the respective local cooling station. The one coolant loop facilitates circulation of coolant between the one cooling subsystem and the liquid-to-air heat exchanger of the respective local cooling station, and heat is transferred via the circulating coolant from the respective electronic subsystem, and rejected in the liquid-to-air heat exchanger of the respective local cooling station to the cooling airflow passing across the liquid-to-air heat exchanger.

In another aspect, a data center is provided which includes at least one electronics rack comprising at least one electronic subsystem, and a cooling apparatus for cooling the at least one electronic subsystem of the at least one electronics rack. The cooling apparatus includes: at least one local cooling station associated with the at least one electronics rack comprising the at least one electronic subsystem, each local cooling station comprising a liquid-to-air heat exchanger, and ducting for directing a cooling airflow across the liquid-to-air heat exchanger; at least one cooling subsystem associated with the at least one electronic subsystem, one cooling subsystem of the at least one cooling subsystem being associated with a respective electronic subsystem of the at least one electronic subsystem, the one cooling subsystem comprising at least one of a housing facilitating immersion cooling of one or more electronic components of the respective electronic subsystem, or a liquid-cooled structure providing conductive cooling of one or more electronic components of the respective electronic subsystem; and at least one coolant loop, one coolant loop of the at least one coolant loop coupling the one cooling subsystem to the liquid-to-air heat exchanger of the respective local cooling station. The one coolant loop facilitates circulation of coolant between the one cooling subsystem and the liquid-to-air heat exchanger of the respective local cooling station, and heat is transferred via the circulating coolant from the respective electronic subsystem, and rejected in the liquid-to-air heat exchanger of the respective local cooling station to the cooling airflow passing across the liquid-to-air heat exchanger.

In a further aspect, a method of cooling at least one electronic subsystem of an electronics rack is provided. The method includes: obtaining a cooling apparatus comprising: a local cooling station, the local cooling station including a liquid-to-air heat exchanger, and ducting for directing cooling airflow across the liquid-to-air heat exchanger; at least one cooling subsystem for association with the at least one electronic subsystem, one cooling subsystem of the at least one cooling subsystem to provide cooling to a respective electronic subsystem of the at least one electronic subsystem, the one cooling system comprising at least one of a housing facilitating immersion cooling of one or more electronic components of the respective electronic subsystems, or a liquid-cooled structure providing conductive cooling of one or more electronic components of the respective electronic subsystem; and at least one coolant loop for coupling the one cooling subsystem to the liquid-to-air heat exchanger of a respective local cooling substation; disposing the electronics rack and the respective local cooling station adjacent to each other, and employing the one coolant loop to couple in fluid communication the one cooling subsystem associated with the respective electronic subsystem and the liquid-to-air heat exchanger of the respective local cooling station; and establishing cooling airflow through the ducting and across the liquid-to-air heat exchanger, and circulation of coolant through the liquid-to-air heat exchanger, the coolant loop and the one cooling subsystem, wherein heat is transferred via the circulating coolant from the respective electronic subsystem and rejected in the liquid-to-air heat exchanger of the respective local cooling station to the cooling airflow passing across the liquid-to-air heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4 is a partial top plan view of the data center of FIG. 2, in accordance with one or more aspects of the present invention;

FIG. 8A depicts one embodiment of processing for controlling operation of the evaporative cooling system of a cooling apparatus, such as depicted in FIGS. 2-6C, in accordance with one or more aspects of the present invention;

FIG. 8B is a schematic of one embodiment of a controllable evaporative cooling system employed in a cooling apparatus, such as depicted in FIGS. 2-6C, in accordance with one or more aspects of the present invention.

DETAILED DESCRIPTION

Figure 1:
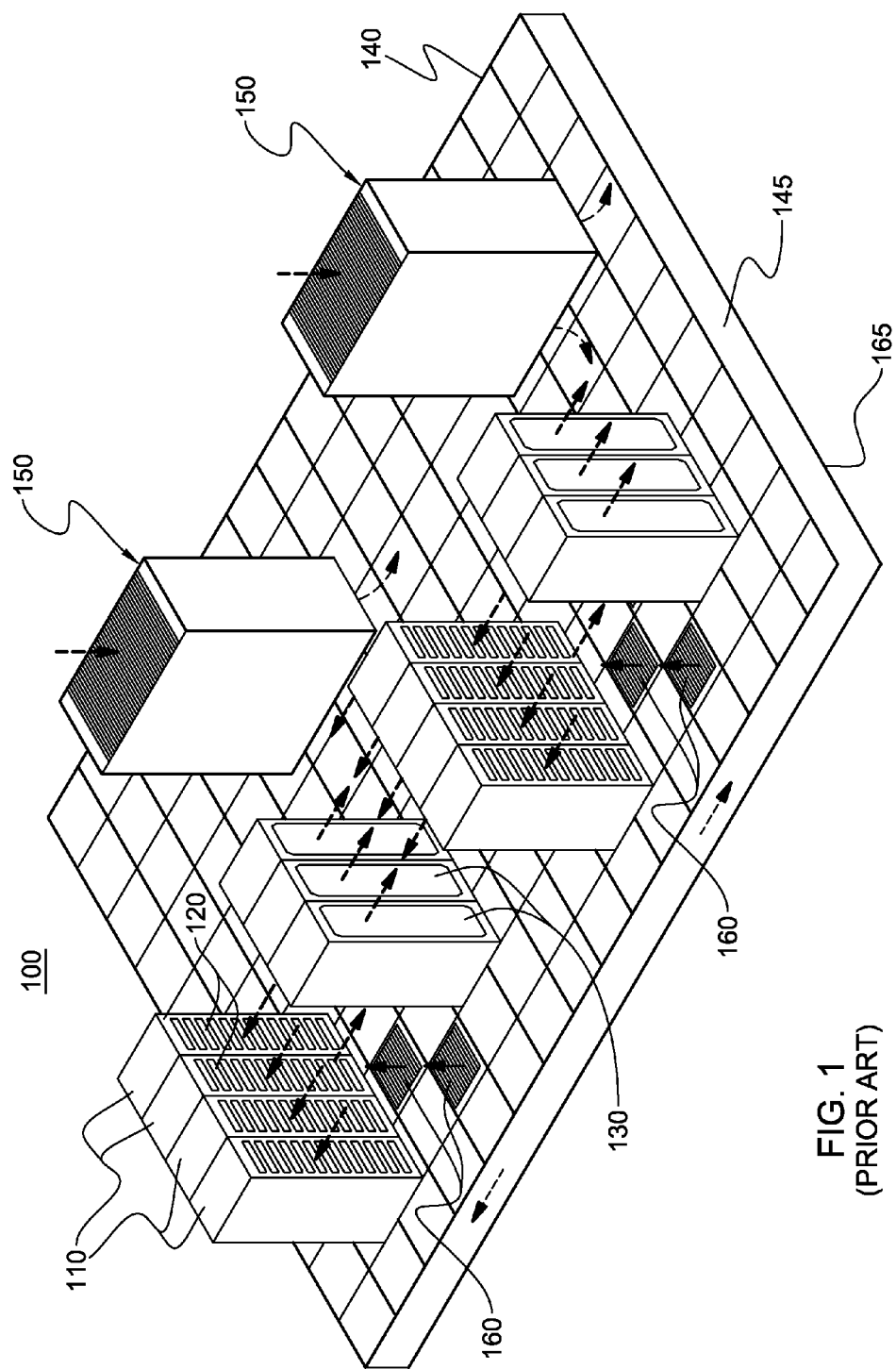
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronic system requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

Unless otherwise specified herein, the terms "liquid-cooled structure" and "liquid-cooled cold plate" refer to thermally conductive structures having one or more channels (or passageways) or chambers formed therein or passing therethrough, which facilitate flow of coolant therethrough. In one example, tubing may be provided extending into or through the liquid-cooled structure (or liquid-cooled cold plate).

As used herein, "liquid-to-air heat exchanger" means any heat exchange mechanism characterized as described herein through which liquid coolant can circulate; and includes, one or more discrete liquid-to-air heat exchangers coupled either in series or in parallel. A liquid-to-air heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. Further, as used herein "data center" refers to a computer installation containing, for example, one or more electronics racks to be cooled. As a specific example, a data center may include one or more electronic racks, such as server racks.

One example of the coolant employed herein is water. However, the concepts disclosed herein are readily adapted to use with other types of coolant. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Due to the ever-increasing airflow requirements through electronics racks, and the limits of air distribution within the typical data center installation, novel cooling apparatuses and methods are needed. Disclosed herein, therefore, are cooling apparatuses and methods combining a liquid-based cooling approach with, for example, an air-side economizer, for extracting heat from the liquid-based cooling approach. FIGS. 2-9 illustrate various embodiments of a data center implementing such cooling apparatuses and methods for cooling electronic subsystems of one or more electronics racks, in accordance with one or more aspects of the present invention.

As noted initially, data center equipment may house several hundred, or even several thousand heat-generating electronic components, such as microprocessors. Cooling computer and telecommunications equipment rooms can be a major challenge. In fact, cooling has been found to contribute about one-third of the energy use of a typical IT data center.

In a conventional data center, sub-ambient temperature, refrigerated water leaves a chiller plant evaporator and is circulated through one or more CRAC units (see FIG. 1) using building chilled water pumps. This water carries heat away from the air-conditioned, raised floor room that houses the IT equipment, and rejects the heat into the refrigeration chiller evaporator via a heat exchanger. The refrigeration chiller operates on a vapor-compression cycle that consumes compression work (compressor). The refrigerant loop rejects the heat into a condenser water loop using another chiller heat exchanger (condenser). A condenser pump circulates water between the chiller condenser and the air-cooled, evaporative cooling tower. The air-cooled cooling tower uses forced air movement and water evaporation to extract heat from the condenser water loop, and transfer it into the ambient environment. Thus, in such a "standard" facility cooling design, the primary cooling energy consumption components are: the server fans; the computer room air-conditioning (CRAC) unit blowers; the building chilled water (BCW) pumps; the refrigeration chiller compressors; the condenser water pumps; and the cooling tower fans.

As a departure from this typical cooling approach, a cooling apparatus and method are disclosed herein which provide energy efficient cooling of electronic subsystems, such as servers, and other information technology equipment, of a data center. As described below, in one embodiment, outdoor air is drawn in and conditioned as a cooling airflow to which heat is rejected from one or more liquid-cooled electronic subsystems of one or more electronics racks within the data center. The outdoor air may be used "as is", or may be conditioned using, for example, a filter and an evaporative cooling system in which water is sprayed onto a porous media, while the outdoor air is forced through the media, thus evaporating the water resident on the surfaces of the porous media directly into the air. Such evaporative cooling system, which reduces the dry bulb temperature of the air, may comprise a commercially available system, such as the evaporative cooling systems available from Munters Corporation, of Amesbury, Mass., U.S.A. Using such an evaporative cooling system can reduce the temperature of the outdoor air drawn into the cooling apparatus to be close to the air's wet bulb temperature. Thus, in hot summer months, the use of evaporative cooling (for example, at the inlet of a cooling airflow supply plenum of the cooling apparatus) can provide significant reduction in the intake air temperature, that is, significant reduction of the temperature of the outdoor air used for indoor cooling, as described hereinbelow.

Unfortunately, it can be problematic to use outdoor air directly inside a data center room, even with further cooling using evaporative methods. Outdoor air can often possess several undesirable attributes, such as containing particulate pollution or chemical or gaseous pollution, which both can be extremely harmful to electronic hardware. Thus, disclosed herein is a data center cooling system that possess the beneficial energy-saving attributes of an air-side, economizer-based cooling approach, but which also provides protection from the harmful properties of the outdoor air.

Figure 2:
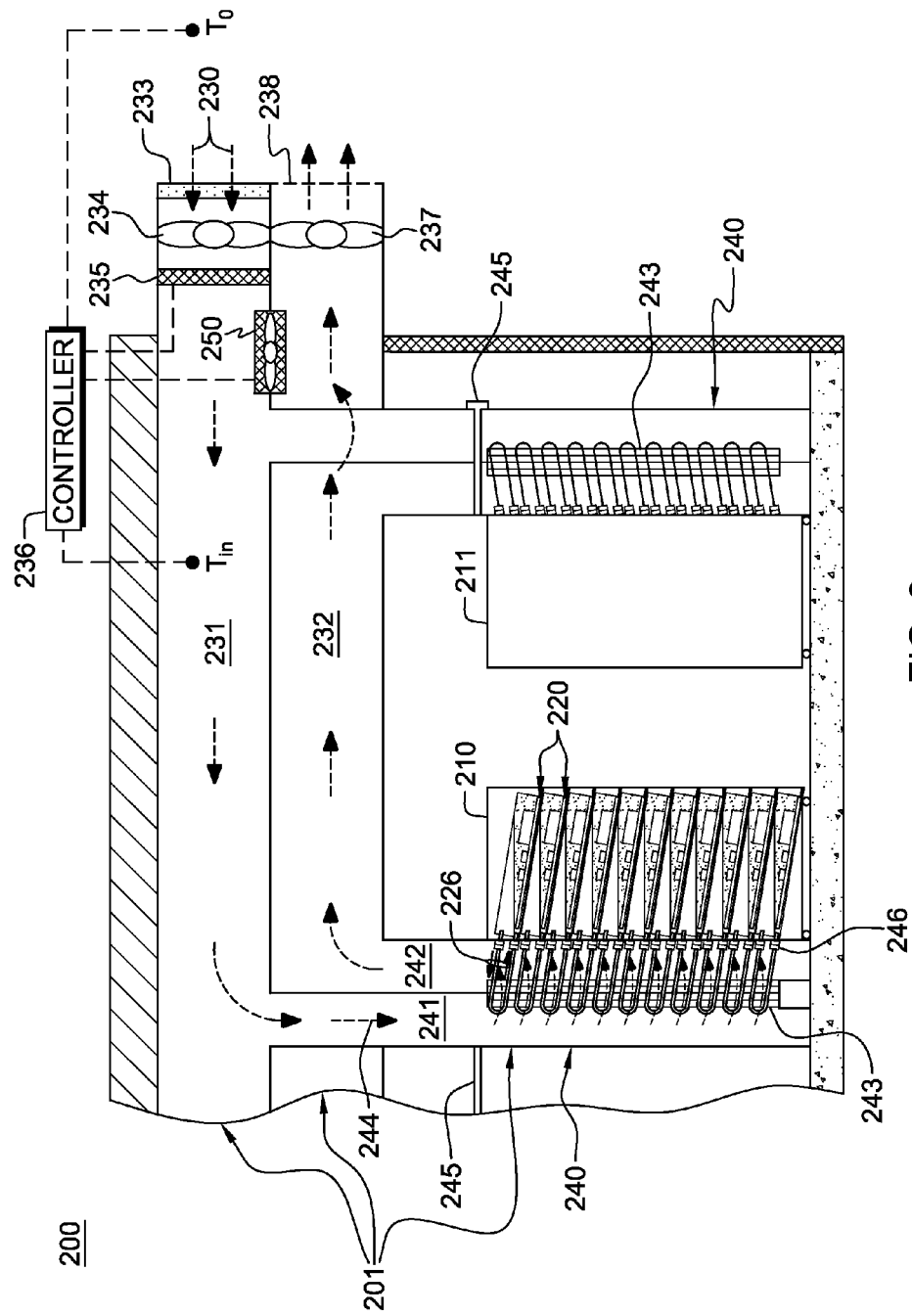
FIG. 2 is a schematic of one embodiment of a data center comprising one or more electronics racks and a cooling apparatus, in accordance with one or more aspects of the present invention.
Figure 3:
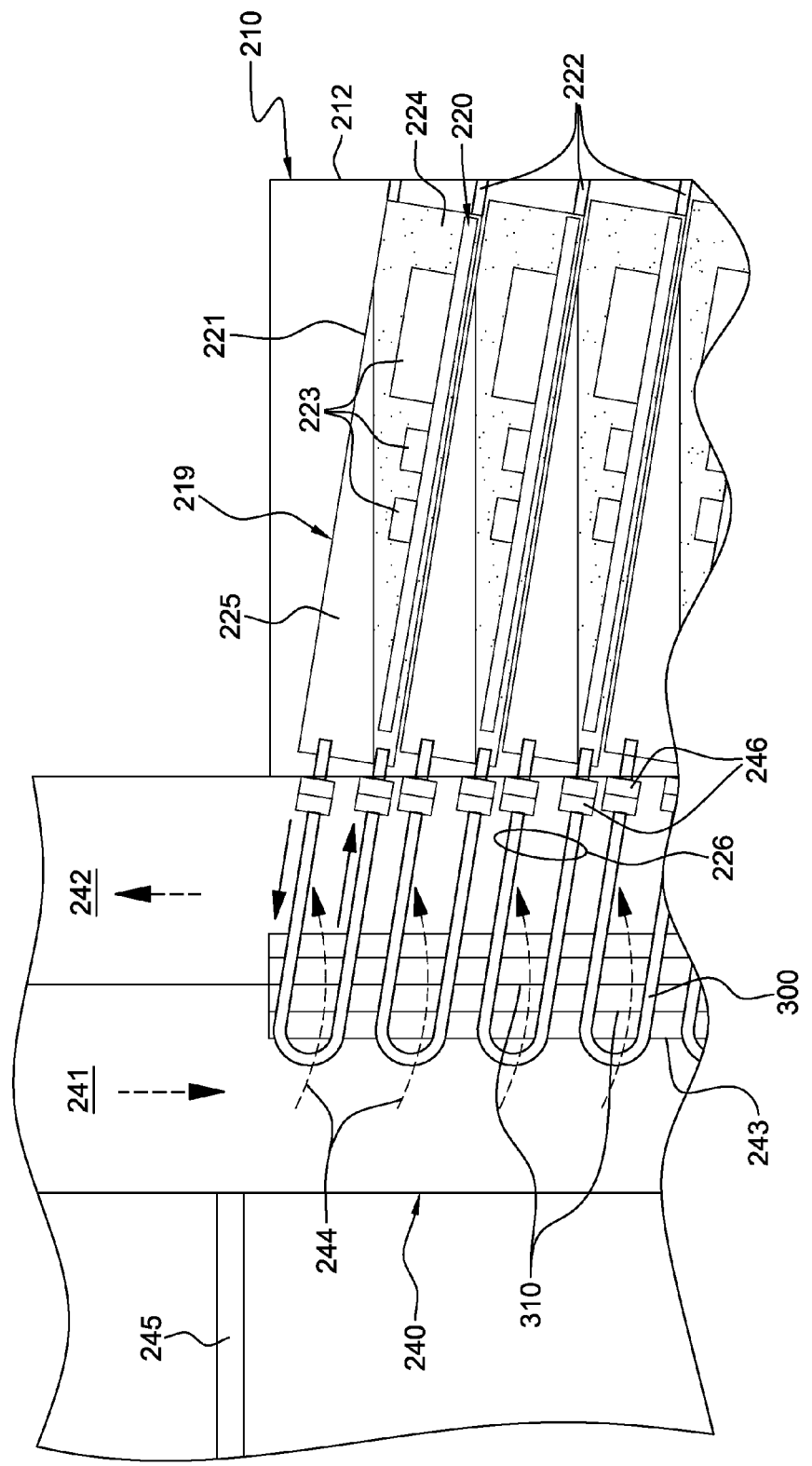
FIG. 3 is an enlarged, partial schematic of the cooling apparatus and electronics rack depicted in FIG. 2, in accordance with one or more aspects of the present invention.

FIGS. 2 & 3 depict a data center, generally denoted 200, comprising one embodiment of such a cooling apparatus. As shown, cooling apparatus 200 comprises an air-side economizer 201 and liquid-based cooling of one or more electronic subsystems 220 of one or more electronics racks 210. In the depicted embodiment, data center 200 includes multiple local cooling stations 240, each of which is (in one embodiment) associated with, but free-standing from, a respective electronics rack 210 comprising one or more electronic subsystems to be cooled. Local cooling station 240 includes (in one embodiment) a vertically-extending, liquid-to-air heat exchanger 243 and supply and return ducting 241, 242 for directing a cooling airflow 244 across liquid-to-air heat exchanger 243.

The liquid-based cooling aspect of the cooling apparatus includes, in one embodiment, multiple cooling subsystems 219 associated with the multiple electronic subsystems 220, and together forming multiple liquid-cooled electronic subsystems. As shown in FIG. 3, each cooling subsystem 219 comprises (in this embodiment) a housing 221 which encloses a respective electronic subsystem 220 comprising a plurality of electronic components 223. In this implementation, the electronic components are (by way of example) immersion-cooled in a coolant 224, such as a dielectric coolant. The cooling system is designed for the dielectric coolant to boil in typical operation, generating dielectric coolant vapor 225. As illustrated, electronic subsystems 220 are angled by providing upward-sloped support rails 222 within electronics rack 210 to accommodate the electronic subsystems 220 at an angle. Angling of the electronic subsystems as illustrated facilitates buoyancy-driven circulation of coolant vapor 225 between the cooling subsystem 219 and the liquid-to-air heat exchanger 243 of the associated local cooling station 240.

In the embodiment depicted in FIGS. 2 & 3, the cooling apparatus further includes multiple coolant loops 226 coupling in fluid communication the liquid-cooled electronic subsystems and a respective portion of liquid-to-air heat exchanger 243. In particular, multiple sloped tubing sections 300 are provided, as illustrated in FIGS. 2 & 3, passing through liquid-to-air heat exchanger 243. Liquid-to-air heat exchanger 243 further includes, in this example, a plurality of air-cooling fins 310 which may be, in one example, oriented vertically within the liquid-to-air heat exchanger 243. The configuration of the plurality of air-cooled fins 310 and the multiple sloped tubing sections 300 may be chosen to facilitate the passage of cooling airflow 244 across the liquid-to-air heat exchanger, which in this two-phase example, functions as a condenser for the coolant vapor circulating therethrough.

In the example of FIGS. 2 & 3, the liquid-cooled electronic subsystems remain accessible through a front 212 of the electronics rack 210, and multiple quick connect couplings 246 are provided in association with the multiple coolant loops 226 to facilitate connection or disconnection of the respective liquid-cooled electronic subsystem(s) from the local cooling station 240. The multiple coolant loops may include flexible tubing, and quick connect couplings 246 may be any one of various types of commercially available couplings, such as those available from Colder Products Co., of St. Paul, Minn., USA, or Parker Hannifin, of Cleveland, Ohio, USA.

As noted, dielectric coolant vapor 225 is buoyancy-driven from housing 221 to the corresponding sloped tubing section 300 of liquid-to-air heat exchanger 243, where the vapor condenses and is then returned as liquid to the associated liquid-cooled electronics subsystem. In one embodiment, the local cooling station 240 is free-standing and separate from electronics rack 210, with the liquid coolant loops 226 being completed by positioning electronics rack 210 adjacent to the respective local cooling station 240, and attaching the quick connect couplings.

As illustrated in FIG. 2, an airflow damper 245 is provided to control the amount of cooling airflow 244 flowing through supply ducting 241 to liquid-to-air heat exchanger 240. When associated with no electronics rack or an empty electronics rack 211 that is awaiting the electronic subsystems (e.g., server units), the respective airflow damper 245 may be moved to a closed position, as illustrated on the right side of FIG. 2, to prevent cooling airflow from passing through the liquid-to-air heat exchanger 243 of the associated local cooling station 240. In the embodiment of FIG. 2, air-side economizer 201 further includes a cooling airflow supply plenum 231 and an airflow exhaust plenum 232. Cooling airflow supply plenum 231 receives outdoor air 230 after being drawn across a filter 233 via an outdoor air intake fan 234. In the embodiment depicted, an evaporative cooling system 235 and associated controller 236 are provided to selectively cool the outdoor air, depending upon its temperature, as explained further below.

In one embodiment, cooling airflow 244 is provided in parallel to the supply ducting 241 of multiple local cooling stations 240 of data center 200, and the heated airflow is exhausted via return ducting 242 in parallel from the multiple cooling stations to the airflow exhaust plenum 232. In this embodiment, the cooling airflow supply plenum and airflow exhaust plenum comprise overhead plenums within the data center.

FIG. 4 illustrates one embodiment of a plurality of local cooling stations 240 and an associated row of electronics racks 210, as well as an associated row of empty electronics racks 211. In this embodiment, the liquid-to-air heat exchangers 243 are either door-mounted or pivotally-mounted, liquid-to-air heat exchangers, which facilitates access to, for example, the quick connect couplings (see FIGS. 2 & 3) disposed within or adjacent to return ducting 242. As noted, cooling airflow 244 flows down the respective supply ducting 241, is directed across the liquid-to-air heat exchanger 243 before being exhausted via return ducting 242 to, for example, the airflow exhaust plenum 232 (see FIG. 2). In the example of FIG. 4, the airflow dampers 245 on the right side are shown in closed position for the local cooling stations 240 associated with the empty electronics racks 211.

FIG. 2 also illustrates a controllable recirculation fan 250, which comprises a fan that is selectively controlled (as explained further below), for example, during winter months, in order to recirculate a portion of the heated airflow exhaust in the airflow exhaust plenum 232 directly into the cooling airflow supply plenum 231 for mixing with the cold outdoor air 230, drawn into the cooling apparatus. In winter operation, the evaporative cooling system 235 would be shut OFF by controller 236.

To summarize, in operation, outdoor air 230 is drawn in through, for example, particulate filter 233, and may be forced through an evaporative cooling system 235, after which it is distributed via the cooling airflow supply plenum 231 to various parts of data center 200. The cooling airflow supply plenum 231 feeds several vertical supply ducts 241 with cooling airflow 244, and this cooling airflow passes through the respective liquid-to-air heat exchangers 243, and returns via vertical return ducting 242, to airflow exhaust plenum 232, where it is exhausted through an exhaust vent 238 by an exhaust fan 237 to the outside of the data center. While the intake and exhaust openings to the cooling airflow supply plenum and airflow exhaust plenum, respectively, are shown in FIG. 2 adjacent to each other, in reality, the intake and exhaust openings may be disposed remote from each other. By remotely disposing the intake and exhaust openings, any mixing of the warm exhaust air with the cooler intake air can be avoided. As explained further below, in winter months, when the outdoor air temperature may be quite cold, the outdoor air temperature may be heated by recirculating the warmer exhaust air (as shown in FIG. 2) wherein the controllable recirculation fan 250 is provided, along with an appropriate opening, to facilitate controlled heating of the intake air using the warmer exhaust air stream.

As described above, in the embodiment depicted in FIGS. 2-4, the electronic subsystems (e.g., server nodes) are immersion-cooled, and are docked using sloped rack rails 222 which angle upwards from front side 212 of the rack. The immersion-cooled electronic subsystems contain electronic components 223, such as a printed circuit board, microprocessor modules, and memory devices, that are packaged within housing (or container) 221 filled, in this example, with dielectric coolant 224. The coolant boils where in contact with the electronic components, and the vapor exits the liquid-cooled electronic subsystem via exhaust tubing of a coolant loop 226 to a respective tubing section 300 in the liquid-to-air heat exchanger 243. In this example, the liquid-to-air heat exchanger contains several parallel tubing sections 300 through which vapor from different subsystems is condensed, and subsequently returned back to the respective liquid-cooled electronic subsystem to repeat the cooling cycle. The sloped nature of the electronic subsystems facilitates the upwards and natural travel of the vapor to the heat exchanger tube sections, and then the natural downward return of the liquid condensate back to the electronic subsystems. Thus, dielectric coolant circulation (in one example) is via buoyancy-driven flow.

As noted, an airflow damper may be placed in open position to allow unimpeded flow of cooling airflow through the vertical supply duct and vertical return duct, or may be placed in closed position when an empty electronics rack (or no electronics rack) is disposed adjacent to the respective local cooling station. In the closed position, the vertical supply and return ducts are blocked by the damper, which cuts off airflow through the local cooling station, thus preventing wasting of pumped airflow within the data center.

Quick connect couplings provided at (for example) inlet and outlet ports of each of the parallel-coupled coolant loops facilitate connection and disconnection of the respective liquid-cooled electronic subsystems to the respective local cooling station. In operation, the cooling airflow, which cools the liquid-to-air heat exchanger fins, and thus the inside of the sloped tubing sections through which the dielectric vapor flows, should be at a temperature that is well below the condensation temperature of the vapor (i.e., the boiling point of the dielectric). This would allow for a temperature difference between the surface contacting the vapor and the cooling airflow. In one embodiment, at any time during operation of the cooling apparatus and electronics rack, there should be a prevailing liquid coolant level within the liquid-immersed electronic subsystem that submerges most of the heat-generating electronic components of the electronic subsystem.

As illustrated in FIG. 4, the shaped profile of the vertical duct sections 241, 242 facilitates the opening of one or more doors of the local cooling stations (which are substantially coplanar with the ducts) so as to allow servicing of the electronics rack, from the side of the electronics rack disposed adjacent to (or in contact with) the local cooling station. In one embodiment, the doors are coplanar and part of the duct structure, and can be opened as illustrated in FIG. 4. Once the door is opened, the respective liquid-to-air heat exchanger can then be rotated about a separate vertical hinge to allow for access to (for example) the back side of the associated electronics rack, either directly through an opening in return ducting 242, or by selective removal of return ducting 242.

Note that advantageously, the only cooling energy consumed in the cooling apparatus of FIGS. 2-4 is at the intake and exhaust fans, the selectively operated recirculation fan, and the selectively operated evaporative cooling system (e.g., the water pump for distributing water to the evaporative cooling media of the system).

Figure 5A:
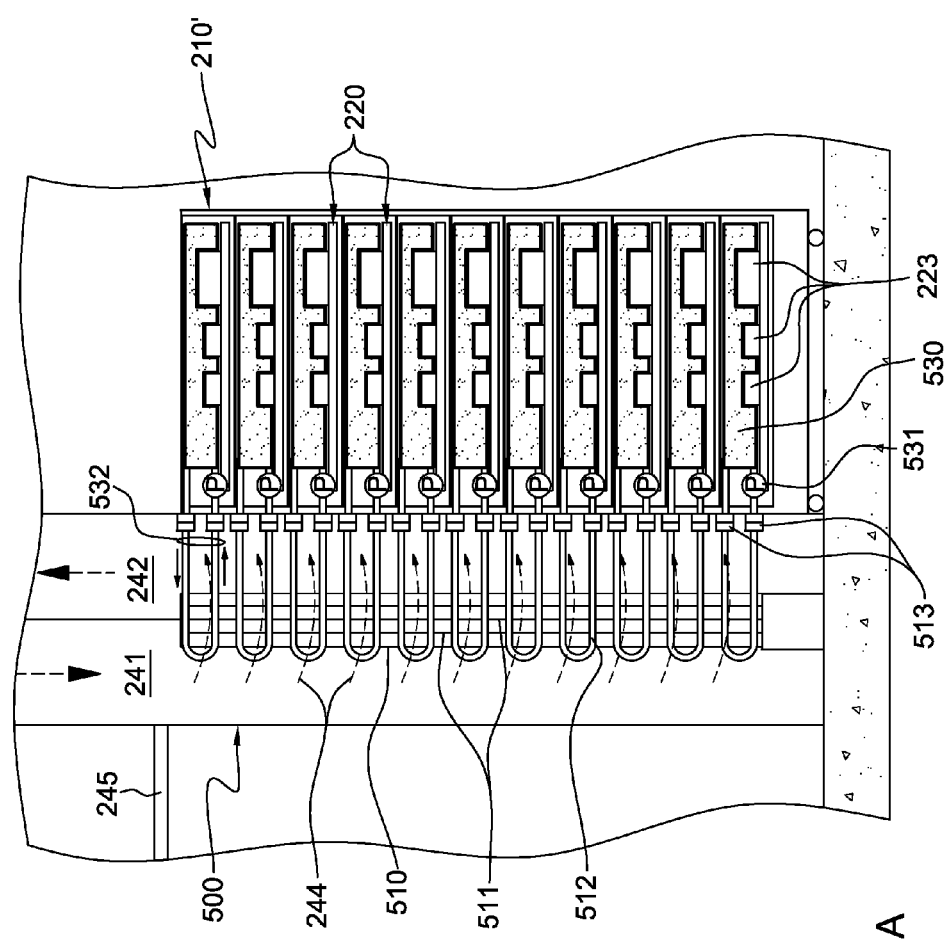
FIG. 5A is a schematic of an alternate embodiment of a data center comprising a cooling apparatus, including an air-side economizer facilitating liquid-based cooling of one or more associated electronics racks, in accordance with one or more aspects of the present invention.
Figure 5B:
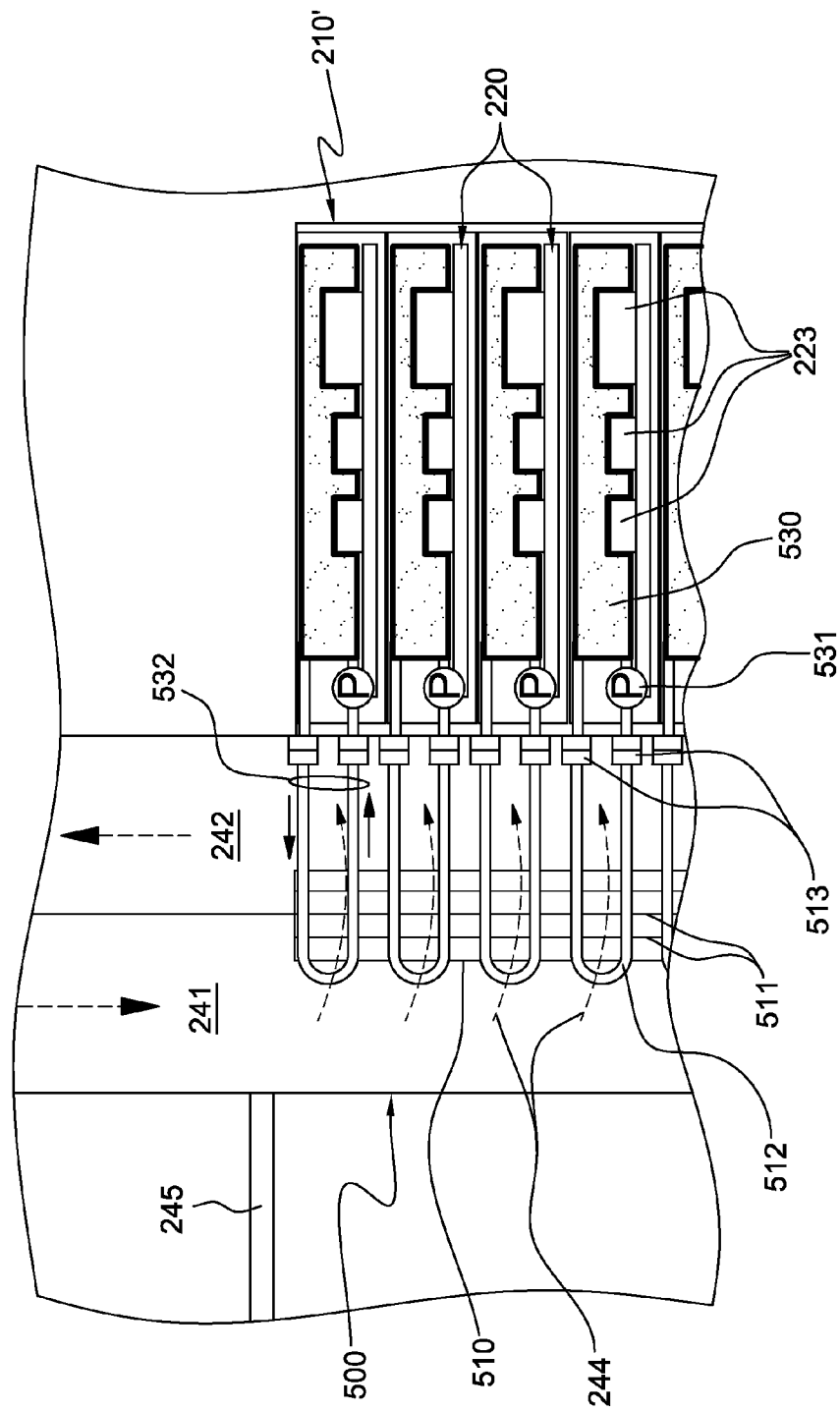
FIG. 5B is an enlarged, partial schematic of the cooling apparatus and associated electronics rack of FIG. 5A, in accordance with one or more aspects of the present invention.

FIGS. 5A & 5B depict an alternate embodiment of a cooling apparatus such as described above in connection with FIGS. 2-4. In this alternate embodiment, the liquid-cooling approach is modified to incorporate a liquid-cooled structure 530 within (in one embodiment) each of the respective electronic subsystems 220 of the electronics rack 210'. As illustrated, the liquid-cooled structures 530 are configured, in one embodiment, to overlie and to provide conduction cooling to one or more electronic components 223 of electronic subsystem 220. In one embodiment, the liquid-cooled structures 530 are water-cooled, with water being pumped through the respective liquid-cooled structures via one or more respective node-level pumps 531 disposed, in this example, within or at the electronic subsystem 220.

As illustrated in FIGS. 5A & 5B, the local cooling station 500 includes ducting 241, 242, as described above in connection with FIGS. 2-4, which receive cooling airflow 244 from a cooling airflow supply plenum and exhaust heated airflow to an airflow exhaust plenum, as described. The cooling airflow 244 passes through a liquid-to-air heat exchanger 510, which is configured with a plurality of tube sections 512, each of which is approximately aligned to a respective electronics subsystem 220 of the associated electronics rack 210' disposed adjacent to the local cooling station 500. Liquid-to-air heat exchanger 510 further includes a plurality of air-cooled fins 511 coupled in thermal communication with the coolant-carrying tube sections 512 of the heat exchanger. Coolant loops 532 are provided to couple the cooling subsystems, in this case, comprising liquid-cooled structures 530 to the respective coolant-carrying tube sections 512 of liquid-to-air heat exchanger 510. Quick connect couplings 513, such as the quick connect couplings described above with reference to FIGS. 2-4, may be employed in association with the coolant loops 532 to provide quick connection or disconnection of a respective liquid-cooled electronic subsystem to the local cooling station 500.

In operation, coolant, such as water, or other single-phase liquid coolant, may be circulated via the node-level pumps through the liquid-cooled structures 530, coolant loops 532, and respective coolant-carrying tube sections 512 of the liquid-to-air heat exchanger 510. The liquid-cooled structure 530 within a particular electronic subsystem may comprise a single liquid-cooled structure, or multiple liquid-cooled structures, such as a plurality of liquid-cooled cold plates, or other such conduction-based structures, coupled in fluid communication, either in series or in parallel within the liquid-cooled electronic subsystem. Since there is no buoyancy-driven flow in this embodiment, the electronic subsystems do not need to be sloped, as in the embodiment of FIGS. 2-4.

Figure 6A:
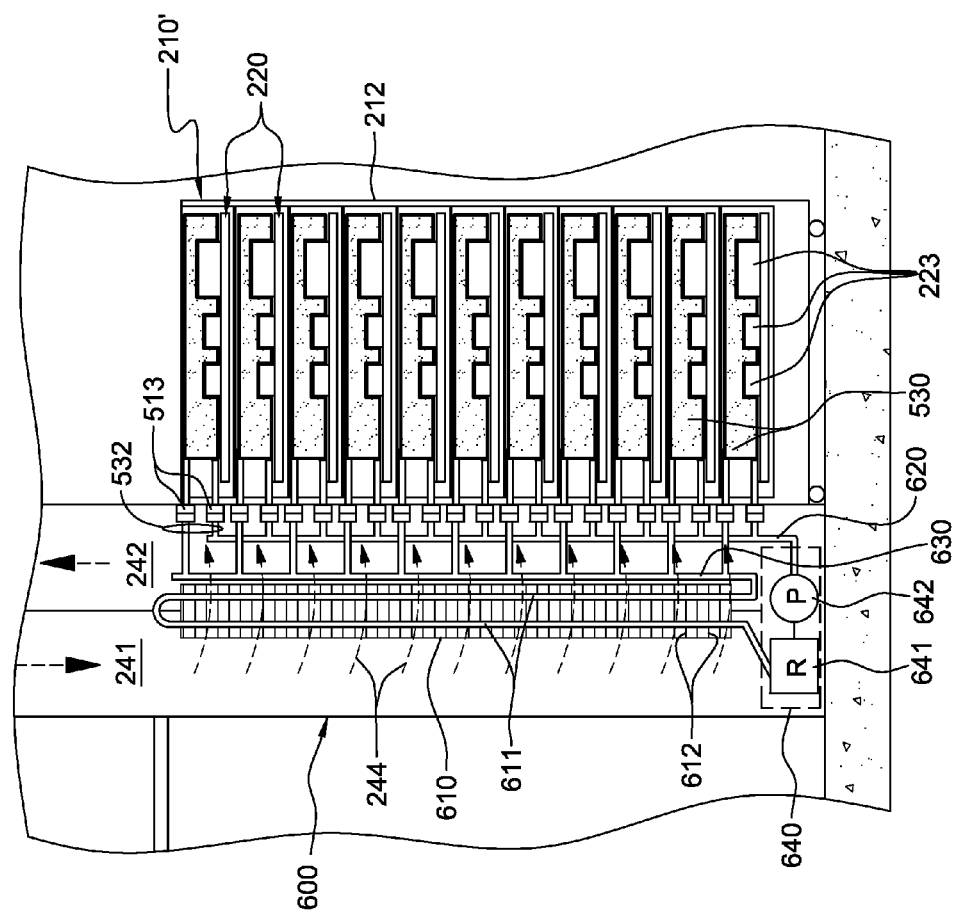
FIG. 6A is a schematic of an alternate embodiment of a data center comprising a cooling apparatus, including an air-side economizer facilitating liquid-based cooling of one or more electronics racks, in accordance with one or more aspects of the present invention.
Figure 6B:
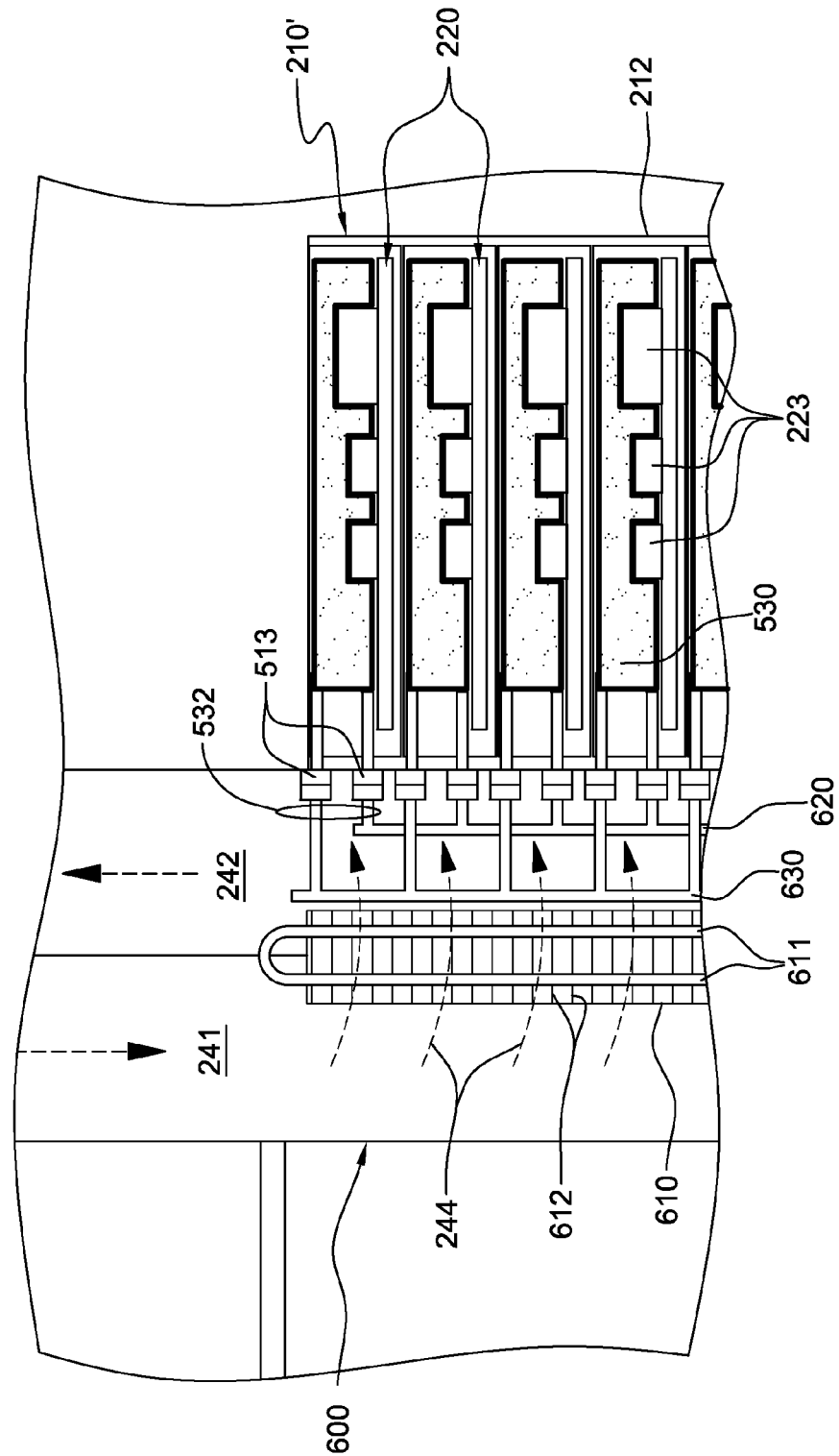
FIG. 6B is an enlarged, partial schematic of the cooling apparatus and associated electronics rack of FIG. 6A, in accordance with one or more aspects of the present invention.
Figure 6C:
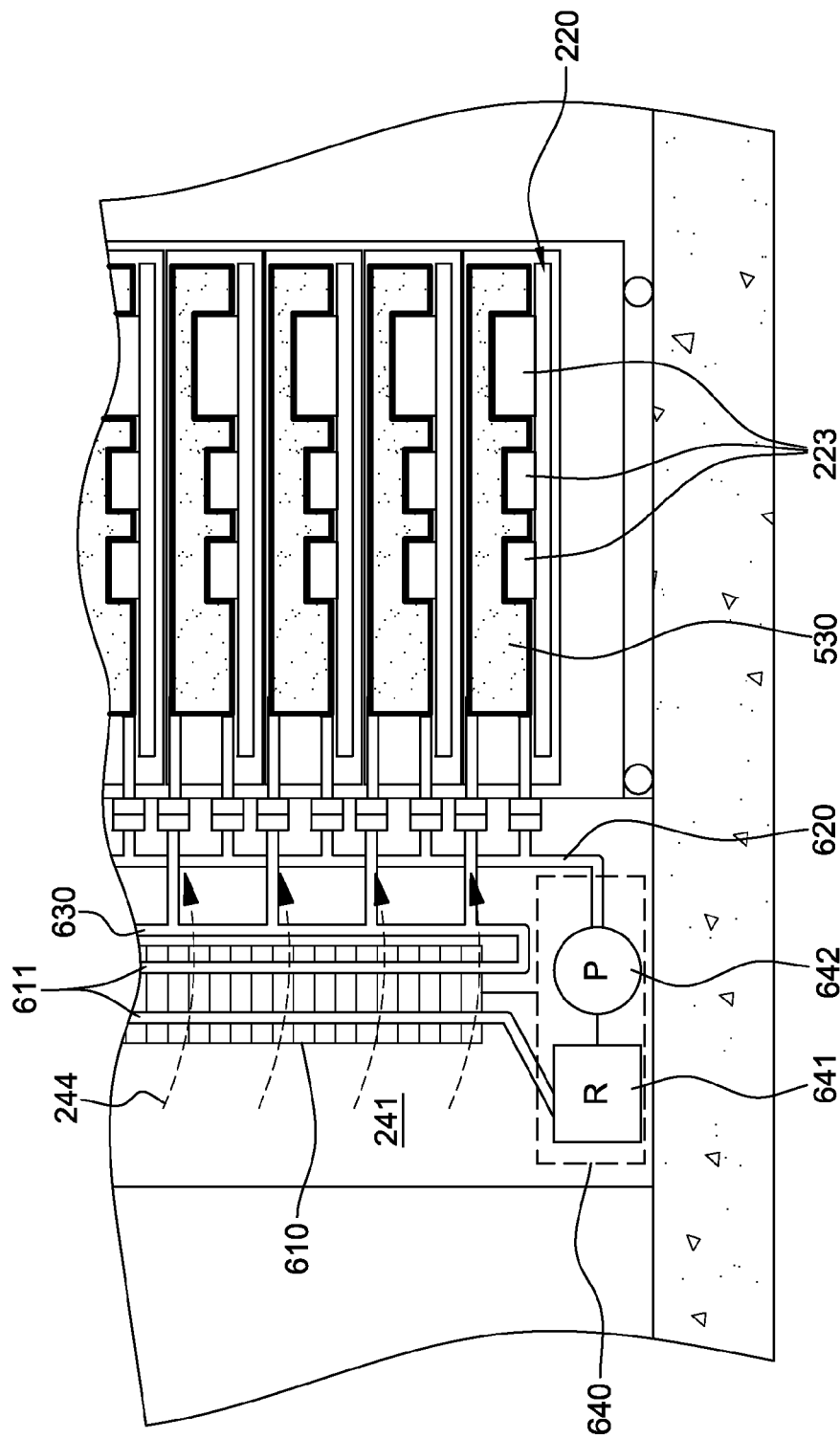
FIG. 6C is another enlarged, partial schematic of the cooling apparatus and associated electronics rack of FIG. 6A, in accordance with one or more aspects of the present invention.

FIGS. 6A-6C depict a further embodiment of a cooling apparatus, in accordance with one or more aspects of the present invention. This cooling apparatus includes an air-side economizer similar to that described above in connection with FIGS. 2-4, and liquid-cooled electronic subsystems, such as described above in connection with the embodiment of FIGS. 5A & 5B. In this embodiment, however, the node-level pumps are removed from the individual electronic subsystems 220 and one or more pumps are provided within the local cooling station 600 of the cooling apparatus. In addition, the dedicated coolant-carrying tube sections of the embodiments of FIGS. 2-5B are replaced with common coolant flow tubing through the local cooling station. As illustrated, the local cooling station 600 includes ducting 241, 242, which facilitates passage of cooling airflow 244 across a liquid-to-air heat exchanger 610 of the local cooling station. In this embodiment, the local cooling station 600 includes a coolant distribution unit 640 which comprises, in one embodiment, a coolant reservoir 641 and one or more coolant pumps 642 for pumping cooled liquid coolant via a coolant supply manifold 620 in parallel to the individual liquid-cooled structures 530 within the electronic subsystems 220 of electronics rack 210'. Heated coolant is exhausted via a common coolant return manifold 630 for passage through liquid-to-air heat exchanger 610. In the embodiment illustrated, the common coolant flow tubing 611 within liquid-to-air heat exchanger 610 is oriented vertically within the heat exchanger, and the air-cooled fins 612 are oriented substantially horizontally (by way of example only). Quick connect couplings 513 may also be provided to facilitate connection or disconnection of the respective liquid-cooled electronic subsystems from the local cooling station 600.

Note that in the embodiments described herein, in operation, coolant (whether vapor or liquid) is circulated between the respective cooling subsystems within the associated electronics rack and the liquid-to-air heat exchanger of the adjacent, local cooling station. Heat is transferred via the circulating coolant from one or more heat-generating electronic components within the electronic subsystem, and rejected in the liquid-to-air heat exchanger of the respective cooling station to the cooling airflow passing across the liquid-to-air heat exchanger. The heated airflow is then exhausted via, for example, a common airflow exhaust plenum. Note also that, although described herein as having a one-to-one correspondence between the local cooling station and an electronics rack, a local cooling station could be configured to accommodate, for example, two or more electronics racks, if desired.

Figure 7:
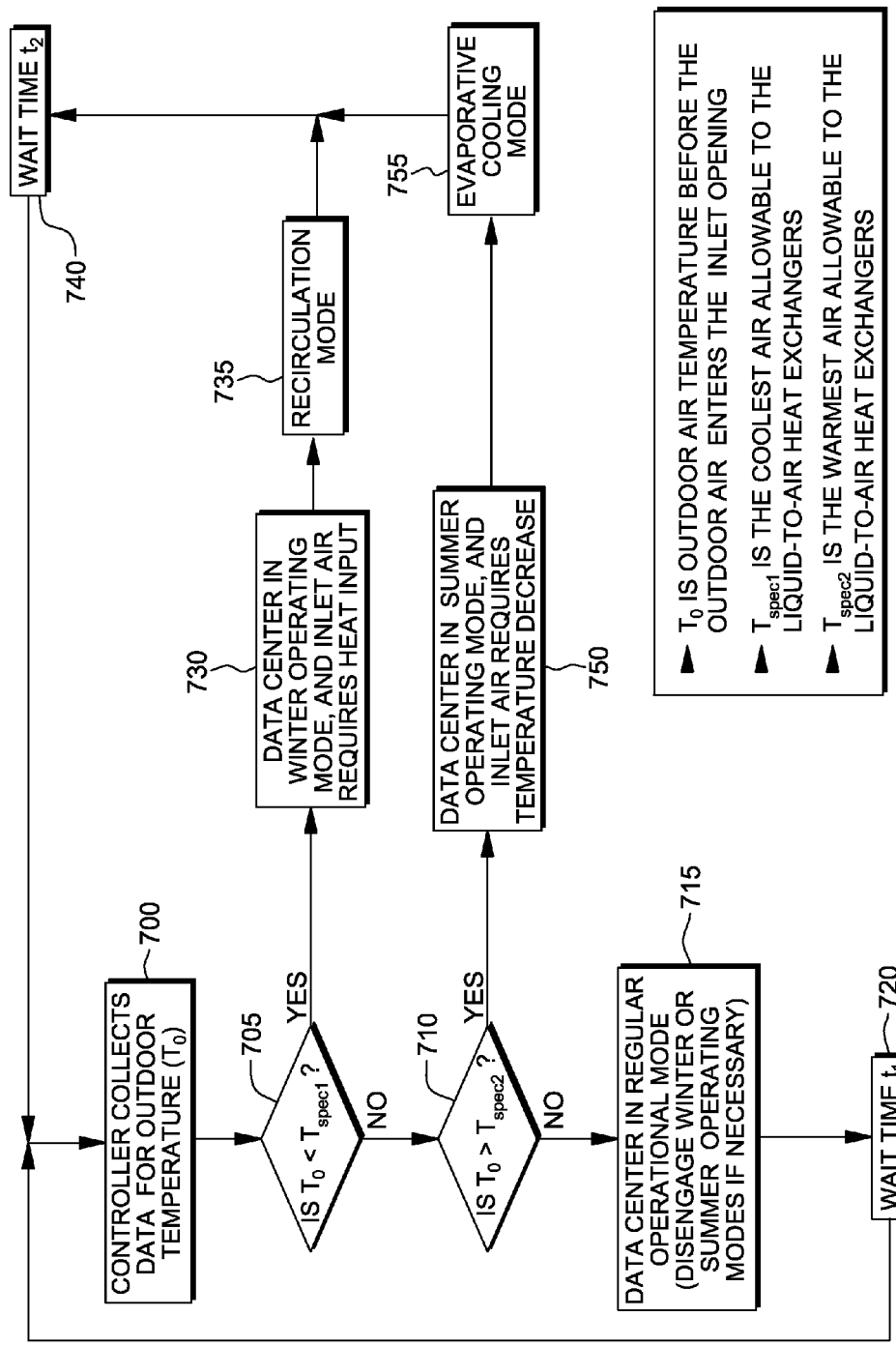
FIG. 7 depicts one embodiment of processing for controlling operation of a cooling apparatus, such as depicted in FIGS. 2-6C, in accordance with one or more aspects of the present invention.
Figure 9:
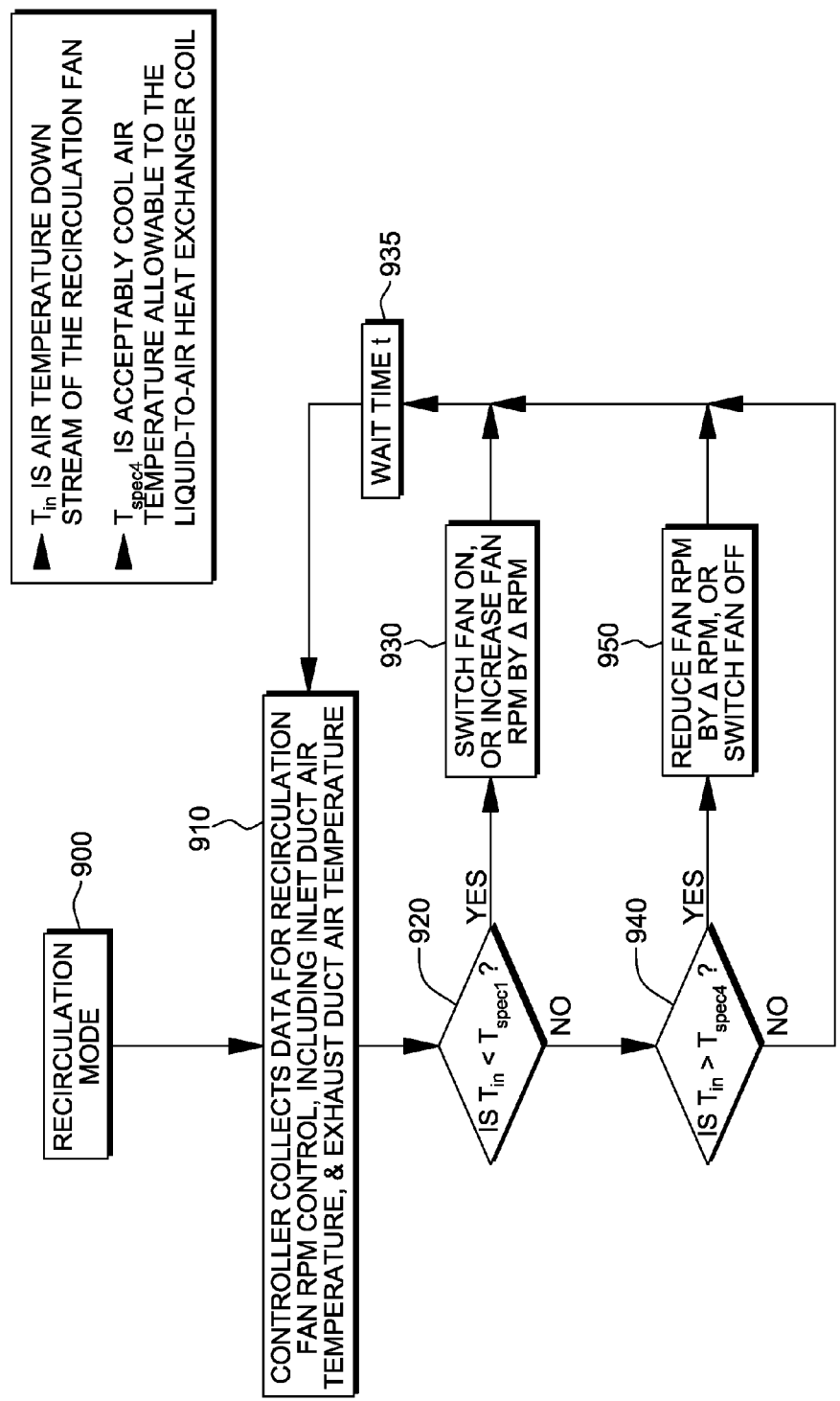
FIG. 9 depicts one embodiment of a process for controlling a controllable recirculation fan coupling the airflow exhaust plenum to the cooling airflow supply plenum of a cooling apparatus, such as depicted in FIGS. 2-6C, in accordance with one or more aspects of the present invention.

FIGS. 7-9 depicts various control processes of a cooling apparatus such as a described above in connection with FIGS. 2-6C. In one embodiment, the control processes may be implemented by a controller associated with the cooling apparatus, such as controller 236 of the cooling apparatus of FIG. 2.

Referring to the process of FIG. 7, the controller collects data on the outdoor temperature at the air intake to the cooling apparatus 700, and determines whether the outdoor temperature ($T_o$) is less than a first temperature threshold ($T_{spec1}$) 705. In one embodiment, the first temperature threshold ($T_{spec1}$) is the coldest air temperature allowable to the liquid-to-air heat exchangers of the local cooling stations without entering a winter mode. Assuming that the outdoor temperature ($T_o$) is greater than or equal to the first specified temperature ($T_{spec1}$), then processing determines whether the outdoor temperature ($T_o$) is greater than a second specified temperature ($T_{spec2}$) 710, which is a threshold of the warmest air temperature allowable to the liquid-to-air heat exchangers without entering a summer mode. Assuming that the outdoor temperature ($T_o$) is less than or equal to the second specified temperature ($T_{spec2}$), then the data center is in regular operating mode 715, and the winter or summer operating modes may be disengaged if previously engaged. Processing then waits a first time interval ($t_1$) 720 before again collecting data on the outdoor air temperature at the intake of the cooling apparatus 700, and repeats the process.

Assuming that the outdoor temperature ($T_o$) is less than the first specified temperature threshold ($T_{spec1}$), meaning that the outdoor temperature has dropped below the coolest allowable air temperature threshold to the liquid-to-air heat exchangers, then the controller places the cooling apparatus in winter mode, meaning that the air inlet temperature requires heating 730. Responsive to this, processing initiates recirculation mode to redirect a portion of the warm airflow exhausting via the airflow exhaust plenum into the cooling airflow supply plenum 735. Processing then waits a second time interval ($t_2$) 740, before again collecting outdoor temperature readings 700, and repeating the process. Note that in one embodiment, time interval $t_1$ and time interval $t_2$ may be the same time intervals, or may be different intervals.

Assuming that the outdoor temperature ($T_o$) is greater than the second temperature threshold ($T_{spec2}$), then processing places the cooling apparatus in summer operating mode, and initiates a dry bulb temperature decrease of the outdoor air being drawn into the cooling airflow supply plenum across the evaporative cooling system 750. Processing enters the evaporative cooling mode 755 to initiate evaporative cooling of the outdoor air drawn across the evaporative cooling media of the evaporative cooling system, and then waits second time interval ($t_2$) 740 before again collecting outdoor temperature data, and repeating the process.

FIGS. 8A & 8B depict one embodiment of an evaporative cooling process and evaporative cooling system, respectively, in accordance with an aspect of the present invention. Referring to the process of FIG. 8A, evaporative cooling mode 800 is entered with the controller collecting data for controlling evaporative cooler pump ON/OFF, including inlet duct air temperature ($T_{in}$) 810. Processing determines whether the inlet duct air temperature ($T_{in}$) is greater than the second specified temperature ($T_{spec2}$) 820, and if "yes", switches the evaporative cooling pump ON 830. As illustrated in the embodiment of FIG. 8B, the evaporative cooling system may comprise a porous media 801 through which the inlet air passes, a container 802, a pump 803, and one or more spray nozzles 804. Water 805 is pumped via pump 803 to water spray nozzles 804 where it drips down porous media 801 and cools by evaporation the air passing through the porous media. Once the water level falls below a certain threshold (monitored, e.g., using a float valve (not shown)), additional water can be provided to container 802 via a water supply line 806.

Continuing with the processing 840 of FIG. 8A, if the inlet duct air temperature ($T_{in}$) is less than a third specified temperature threshold ($T_{spec3}$) processing switches the pump OFF 850. Otherwise, processing waits a time interval (t) 835 before again collecting the relevant data 810, and repeating the process. Note that in this example, the third specified temperature threshold ($T_{spec3}$) is a defined, acceptable air temperature for the liquid-to-air heat exchangers of the local cooling stations.

FIG. 9 illustrates one embodiment of processing for control of the airflow recirculation mode. As noted, airflow recirculation mode is entered 900 when the outdoor temperature ($T_o$) is below a first specified temperature threshold. Processing initially collects data for control of the recirculation fan's RPMs, including the inlet duct air temperature and the exhaust duct air temperature 910. Processing determines whether the inlet duct air temperature ($T_{in}$) is less than the first temperature threshold ($T_{spec1}$) 920, and if "yes", increases the recirculation fan's speed (RPMs) by a set ARPM 930. If the inlet duct air temperature ($T_{in}$) is greater than or equal to the first temperature threshold ($T_{spec1}$), then processing determines whether the inlet duct air temperature ($T_{in}$) is greater than a fourth specified temperature threshold ($T_{spec4}$). In this processing example, the inlet duct air temperature ($T_{in}$) is the air temperature downstream of the recirculation fan, and the fourth temperature threshold ($T_{spec4}$) is a defined, acceptably cool air temperature that is allowable to the liquid-to-air heat exchanger coil of the local cooling stations. If the inlet duct air temperature ($T_{in}$) is greater than the fourth temperature threshold ($T_{spec4}$) 940, then the recirculation fan's speed may be reduced by the set amount ($\Delta$RPM) 950. Thereafter, processing waits time interval (t) 935 before again collecting temperature data for control of the recirculation fan speed, as described above.

As will be appreciated by one skilled in the art, control aspects of the present invention may be embodied as a system, method or computer program product. Accordingly, control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible, non-transitory medium that can contain or store a program for use by or in connection with an instruction execution system, apparatus, or device.

In one example, a computer program product includes, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus comprising:

at least one local cooling wall station separate and free-standing from at least one electronics rack comprising at least one electronic subsystem to be cooled, one electronics rack of the at least one electronics rack being positioned adjacent to a respective local cooling wall station of the at least one local cooling wall station, the respective local cooling wall station being external to the one electronics rack and the respective local cooling wall station comprising:

a cooling wall;

a liquid-to-air heat exchanger disposed within the cooling wall;

multiple coolant inlet connectors and multiple outlet connectors residing on the cooling wall in fluid communication with at least one coolant-carrying channel passing through the liquid-to-air heat exchanger; and ducting within the cooling wall for directing a cooling airflow across the liquid-to-air heat exchanger of the respective local cooling wall station, wherein the cooling airflow comprises an outdoor airflow drawn into the cooling apparatus to cool liquid coolant passing through the at least one coolant-carrying channel of the liquid-to-air heat exchanger;

at least one cooling subsystem associated with the at least one electronic subsystem, one cooling subsystem of the at least one cooling subsystem being associated with a respective electronic subsystem of the one electronic subsystem, the one cooling subsystem comprising at least one of a housing facilitating immersion-cooling of one or more electronic components of the respective electronic subsystem, or a liquid-cooled structure providing conductive cooling of one or more electronic components of the respective electronic subsystem; and at least one coolant loop, one coolant loop of the at least one coolant loop coupling the one cooling subsystem to one coolant inlet connector of the multiple coolant inlet connectors, and to one coolant outlet connector, of the multiple coolant outlet connectors, to facilitate coolant flow through the at least one coolant-carrying channel of the liquid-to-air heat exchanger of the respective local cooling wall station of the at least one local cooling wall station, wherein heat is transferred via the circulating coolant from the respective electronic subsystem and rejected in the liquid-to-air heat exchanger of the respective local cooling wall station to the cooling airflow passing across the liquid-to-air heat exchanger.

2. The cooling apparatus of claim 1, wherein the electronics rack comprises multiple electronic subsystems, and the cooling apparatus comprises multiple cooling subsystems, each cooling subsystem being associated with a respective electronic subsystem of the multiple electronic subsystems, and wherein the at least one coolant loop couples the multiple cooling subsystems to the liquid-to-air heat exchanger of the respective local cooling station, the at least one coolant loop facilitating circulation of coolant between the multiple cooling subsystems and the liquid-to-air heat exchanger of the respective local cooling wall station of the at least one local cooling wall station, wherein heat is transferred via the circulating coolant from the multiple electronic subsystems and rejected in the liquid-to-air heat exchanger of the respective local cooling wall station to the cooling airflow passing across the liquid-to-air heat exchanger.

3. The cooling apparatus of claim 2, further comprising multiple coolant loops, at least one coolant loop of the multiple coolant loops coupling a respective cooling subsystem of the multiple cooling subsystems to the liquid-to-air heat exchanger of the respective local cooling wall station.

4. The cooling apparatus of claim 3, wherein each coolant loop of the multiple coolant loops is associated with a respective cooling subsystem of the multiple cooling subsystems and facilitates circulating of coolant through at least a portion of the liquid-to-air heat exchanger of the respective local cooling wall station.

5. The cooling apparatus of claim 1, wherein the one cooling subsystem of the at least one cooling subsystem comprises an immersion-cooling subsystem providing immersion-cooling to the one or more electronic components of the respective electronic subsystem of the at least one electronic subsystem, and wherein the respective electronic subsystem is angled within the electronics rack to facilitate buoyancy-driven circulation of coolant vapor between the one cooling subsystem and the liquid-to-air heat exchanger of the respective local cooling wall station.

6. The cooling apparatus of claim 1, wherein the liquid-to-air heat exchanger of the respective local cooling wall station is a pivotally-mounted, liquid-to-air heat exchanger within the respective local cooling wall station.

7. The cooling apparatus of claim 1, further comprising a cooling airflow supply plenum and an airflow exhaust plenum, the ducting of the respective local cooling wall station being coupled to the cooling airflow supply plenum and to the airflow exhaust plenum, and the ducting receiving cooling airflow from the cooling airflow supply plenum, directing the cooling airflow across the liquid-to-air heat exchanger, and exhausting heated airflow from the liquid-to-air heat exchanger to the airflow exhaust plenum.

8. The cooling apparatus of claim 7, further comprising a controllable evaporative cooling system associated with the cooling airflow supply plenum for selectively cooling outdoor air being drawn into the cooling airflow supply plenum, and a controller coupled to the controllable evaporative cooling system, the controller activating the controllable evaporative cooling system responsive to a temperature of the outdoor air exceeding a defined high temperature threshold.

9. The cooling apparatus of claim 7, further comprising a controllable recirculation fan for selectively recirculating a portion of exhausting airflow in the airflow exhaust plenum to the cooling airflow supply plenum, and a controller coupled to the controllable recirculation fan, the controller activating recirculation of at least a portion of the exhausting heated airflow in the airflow exhaust plenum to the cooling airflow supply plenum responsive to a temperature of the outdoor air being below a defined low temperature threshold.

10. A data center comprising:
at least one electronics rack comprising at least one electronic subsystem; and
a cooling apparatus for cooling the at least one electronic subsystem of the at least one electronics rack, the cooling apparatus comprising:
at least one local cooling wall station separate and freestanding from the at least one electronics rack comprising the at least one electronic subsystem one electronics rack of the at least one electronics rack being positioned adjacent to a respective local cooling wall station of the at least one local cooling wall station, the respective local cooling wall station being external to the one electronics rack and the respective local cooling wall station comprising;
a cooling wall;
a liquid-to-air heat exchanger disposed within the cooling wall
multiple coolant inlet connectors and multiple outlet connectors residing on the cooling wall in fluid communication with at least one coolant-carrying channel passing, through the liquid-to-air heat exchanger;
and
ducting within the cooling wall for directing a cooling airflow across the liquid-to-air heat exchanger, wherein the cooling airflow comprises an outdoor airflow drawn into the cooling apparatus to cool liquid coolant passing through the at least one coolant-carrying channel of the air-to-liquid heat exchanger;
at least one cooling subsystem associated with the at least one electronic subsystem, one cooling subsystem of the at least one cooling subsystem being associated with a respective electronic subsystem of the at least one electronic subsystem, the one cooling subsystem comprising at least one of a housing facilitating immersion-cooling of one or more electronic components of the respective electronic subsystem, or a liquid-cooled structure providing conductive cooling of one or more electronic components of the respective electronic subsystem; and
at least one coolant loop, one coolant loop of the at least one coolant loop coupling the one cooling subsystem to one coolant inlet connector, of the multiple coolant inlet connectors and to one coolant outlet connector, of the multiple coolant outlet connectors, to facilitate coolant flow through the at least one coolant-carrying channel of the liquid-to-air heat exchanger of the respective local cooling wall station of the at least one local cooling wall station, wherein heat is transferred via the circulating liquid coolant from the respective electronic subsystem and rejected in the liquid-to-air heat exchanger of the respective local cooling wall station to the cooling airflow passing across the liquid-to-air heat exchanger.

11. The data center of claim 10, wherein the electronics rack comprises multiple electronic subsystems, and the cooling apparatus comprises multiple cooling subsystems, each cooling subsystem being associated with a respective electronic subsystem of the multiple electronic subsystems, and wherein the at least one coolant loop couples the multiple cooling subsystems to the liquid-to-air heat exchanger of the respective local cooling station, the at least one coolant loop facilitating circulation of coolant between the multiple cooling subsystems and the liquid-to-air heat exchanger of the respective local cooling wall station of the at least one local cooling wall station, and wherein heat is transferred by the circulating coolant from the multiple electronic subsystems and rejected in the liquid-to-air heat exchanger of the respective local cooling wall station to the coolant airflow passing across the liquid-to-air heat exchanger.

12. The data center of claim 11, further comprising multiple coolant loops, each coolant loop of the multiple coolant loops being associated a respective cooling subsystem of the multiple cooling subsystems, and facilitating circulation of coolant through at least a portion of the liquid-to-air heat exchanger of the respective local cooling wall station.

13. The data center of claim 10, wherein the one cooling subsystem of the at least one cooling subsystem comprises an immersion-cooling subsystem providing immersion cooling to the one or more electronic components of the respective electronic subsystem of the at least one electronic subsystem, and wherein the respective electronic subsystem is angled within the electronics rack to facilitate buoyancy-driven circulation of coolant vapor between the one cooling subsystem and the liquid-to-air heat exchanger of the respective local cooling wall station.

14. The data center of claim 10, further comprising a cooling airflow supply plenum and an airflow exhaust plenum, the ducting of the respective local cooling wall station being coupled to the cooling airflow supply plenum and to the airflow exhaust plenum, and the ducting directing cooling airflow from the cooling airflow supply plenum across the liquid-to-air heat exchanger, and exhausting heated air from the liquid-to-air heat exchanger to the airflow exhaust plenum.

15. The data center of claim 14, further comprising a controllable evaporative cooling system associated with the cooling airflow supply plenum for selectively cooling outdoor air being drawn into the cooling airflow supply plenum, and a controller coupled to the controllable evaporative cooling system, the controller activating the controllable evaporative cooling system responsive to a temperature of the outdoor air exceeding a defined high temperature threshold.

16. The data center of claim 14, further comprising a controllable recirculation fan for selectively recirculating a portion of exhausting airflow in the airflow exhaust plenum to the cooling airflow supply plenum, and a controller coupled to the controllable recirculation fan, the controller activating recirculation of at least a portion of the exhausting heated airflow in the airflow exhaust plenum to the cooling airflow supply plenum responsive to a temperature of the outdoor air being below a defined low temperature threshold.

17. The cooling apparatus of claim 1, wherein the liquid-to-air heat exchanger is a vertically-extending liquid-to-air heat exchanger, and the respective local cooling wall station is a fixed part of a data center's infrastructure.

18. The cooling apparatus of claim 17, wherein the respective local cooling wall station has a height greater than a height of the one electronics rack.

* * * * *